United States Patent
Volovoi (10) Patent No.: US 7,627,459 B2
(45) Date of Patent: Dec. 1, 2009

(54) SYSTEMS AND METHODS FOR RELIABILITY AND PERFORMABILITY ASSESSMENT

(75) Inventor: Vitali Volovoi, Alpharetta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 616 days.

(21) Appl. No.: 11/032,611

(22) Filed: Jan. 10, 2005

(65) Prior Publication Data
US 2005/0166080 A1 Jul. 28, 2005

Related U.S. Application Data

(60) Provisional application No. 60/534,874, filed on Jan. 8, 2004.

(51) Int. Cl.
*G06G 7/48* (2006.01)
(52) U.S. Cl. .................. 703/6; 703/13; 714/1
(58) Field of Classification Search .......... 703/13, 703/7, 6
See application file for complete search history.

(56) References Cited

U.S. PATENT DOCUMENTS

| | | | |
|---|---|---|---|
| 4,814,978 A | 3/1989 | Dennis ..................... 712/201 |
| 5,257,363 A | 10/1993 | Shapiro et al. ................. 703/13 |
| 6,067,357 A | 5/2000 | Kishinsky et al. ....... 379/265.02 |
| 6,185,469 B1 | 2/2001 | Lewis et al. .................... 700/99 |
| 6,233,540 B1 * | 5/2001 | Schaumont et al. ........... 703/14 |
| 6,321,187 B1 | 11/2001 | Squier et al. ................... 703/18 |
| 6,363,494 B1 | 3/2002 | Farah ............................ 714/2 |
| 6,694,505 B1 | 2/2004 | Tan ............................. 717/100 |
| 6,728,664 B1 * | 4/2004 | Fouad ........................... 703/2 |
| 2001/0020230 A1 | 9/2001 | Kaneko et al. .................. 705/8 |
| 2002/0178285 A1 | 11/2002 | Donaldson et al. .......... 709/237 |
| 2003/0004679 A1 | 1/2003 | Tryon, III et al. ............ 702/182 |
| 2003/0191678 A1 | 10/2003 | Shetty et al. .................... 705/8 |
| 2004/0143725 A1 | 7/2004 | Addison ....................... 712/28 |
| 2004/0167763 A1 | 8/2004 | Liebman ...................... 703/11 |
| 2004/0225919 A1 | 11/2004 | Reissman et al. .............. 714/38 |

FOREIGN PATENT DOCUMENTS

JP 334075 12/1998

OTHER PUBLICATIONS

Tamaki et al, "Simulation-Based Scheduling Package Using Generalized Petri Net Models", Proceedings of the International Conference on Industrial Electronics, Control and Instrumentation, vol. 1, pp. 451-456, Nov. 15-19, 1993.*

Zurawski et al, "Petri Nets and Industrial Applications: A Tutorial", IEEE Transactions on Industrial Electronics, vol. 41, No. 6, Dec. 1994.*

(Continued)

*Primary Examiner*—Paul L Rodriguez
*Assistant Examiner*—Mary C Jacob
(74) *Attorney, Agent, or Firm*—Thomas, Kayden, Horstemeyer & Risley, LLP (57) ABSTRACT

A system and method for modeling complex dynamic systems whose properties are non-uniform in the time domain is disclosed. Aging tokens (tokens with memory) are used to tracking the age of a system as a whole, as well as its individual constituents, in the context of stochastic Petri nets.

26 Claims, 5 Drawing Sheets

OTHER PUBLICATIONS

Chaillet et al, "Specification of FMS Real-Time Control Based on Petri Nets with Objects and Process Failure Monitoring", Proceedings of the Industrial Electronics, Control and Instrumentation, vol. 1, pp. 144-149, Nov. 15-19, 1993.*

Valette et al, "Monitoring Manufacturing Systems by Means of Petri Nets with Imprecise Markings", Proceedings of the IEEE International Symposium on Intelligent Control, Sep. 25-26, 1989, pp. 233-238.*

Srinivasan et al, "Fault Detection/Monitoring Using Time Petri Nets", IEEE Transactions of Systems, Man and Cybernetics, vol. 23, No. 4, Jul./Aug. 1993 .*

Peters et al, "The Application of Petri-Nets in Object Oriented Enterprise Simulations", Proceedings of the Twenty-Sixth Hawaii International Conference on System Sciences, vol. IV, Jan. 5-8, 1993, pp. 390-398.*

Zhou et al, "Modeling and Performance Analysis using Extended Fuzzy-Timing Petri Nets for Networked Virtual Environments", IEEE Transactions on Systems, Man and Cybernetics-Part B: Cybernetics, vol. 30, No. 5, Oct. 2000.*

Bobbio et al, "Modeling Software Systems with Rejuvenation, Restoration and Checkpointing through Fluid Stochastic Petri Nets", Proceedings of the 8th International Workshop on Petri Nets and Performance Models, Sep. 8-10, 1999, pp. 82-91.*

Carlson, Jan ("Languages and Methods for Specifying Real-Time Systems", Department of Computer Engineering, Malardalen University, Vasteras, Sweden, 2000.*

Johnson et al ("Survey of Software Tools for Evaluating Reliability, Availability and Serviceability", ACM Computing Surveys, vol. 20, Issue 4, Dec. 1988, pp. 227-269.*

Ghezzi et al, "A General Way to Put Time In Petri Nets", Proceedings of the Fifth International Workshop on Software Specification and Design, pp. 60-67, May 1989.*

Vojnar, Thomas, "Hierarchical and Time Extensions of Pure Object Oriented Petri Nets", Proceedings of the 19th International Workshop on Advanced Simulation of Systems ASIS'97, 1997.*

Liu, Zen, "Performance Analysis of Stochastic Times Petri Nets Using Linear Programming Approach", IEEE Transactions on Software Engineering, vol. 24, No. 11, Nov. 1998.*

Ruiz et al, "On Non-Decidability of Reachability for Timed-Arc Petri Nets", Proceedings of the 8th International Workshop on Petri Nets and Performance Models, Sep. 8-10, 1999.*

Gambin et al, "A Petri Nets Based Object Oriented Took for the Scheduling of Stochastic Flexible Manufacturing Systems", Proceedings of the 7th International Conference on Emerging Technologies and Factory Automation, vol. 2, pp. 1091-1098, Oct. 18-21, 1999.*

* cited by examiner

SYSTEMS AND METHODS FOR RELIABILITY AND PERFORMABILITY ASSESSMENT

CROSS REFERENCE TO RELATED APPLICATIONS

This application claims priority to and benefit of U.S. Provisional Patent Application entitled "System Reliability Assessment Using Extended Petri-net Formalism With Aging Tokens" assigned Ser. No. 60/534,874, and filed on Jan. 8, 2004, which is incorporated by reference in its entirety.

TECHNICAL FIELD

The invention relates generally to systems and methods for reliability and performability assessment, and more particularly, to systems and methods for reliability and performability assessment using an extended Petri net formalism with aging tokens.

BACKGROUND

A number of methods have been used to model the reliability of a complex system. Some of the more relevant methods can be divided into four categories: Boolean logic methods, a problem-specific model written with a general purpose package (e.g. MATLAB), a hybrid of a Boolean logic methods and a problem specific model, and Petri nets.

Boolean Logic Methods

There are two main frameworks that are based on Boolean logic: Reliability Block Diagrams (RBDs) and Fault Tree Analysis (FTA). Together they dominate safety and reliability modeling with the former being more often applied to system reliability, while the latter are more prevalent in the context of safety and Probabilistic Risk Assessment (PRA). RBDs comprise connected-together blocks representing components of a system. The source (input) is usually located at the left of the diagram, and the sink (output) at the right. When a part fails in accordance with a given distribution, the "flow" through the corresponding block stops. If there is an uninterrupted path from the source to the sink, the system is up. Otherwise, the system is down. This representation naturally allows for modeling redundancy. In its standard form, FTA relies on two logical "gates" ("AND" and "OR") to combine "basic events" (i.e., leaves of the tree) into the "top-level event" (root of the tree). This allows evaluating the probability of a top-level event based on given probabilities for basic events.

There are several commercially available tools that are easy to use which provide an intuitive way to build an RBD or conduct FTA such as the "Relex Reliability Block Diagram" and "Relex Fault Tree/Event Tree" software packages produced by Relex Software, Inc. of Greensburg, Pa., and "AvSim+" software produced by Isograph, Inc. of Newport Beach, Calif. However, none of these tools provide the flexibility to model all the important features of systems (e.g. cascading failure effects and the use of new parts) since the modeling of these features is intimately related to the dynamic interactions between the components.

Problem Specific Models

A problem-specific model may be written in a general purpose package such as MATLAB. Such models are very flexible but are expensive to develop, and the complexity becomes prohibitive for large-scale applications since the transparency and simplicity of RBD modeling is lost. Additionally, the reusability of such models is very limited.

Hybrid Boolean Logic and Problem Specific Models

One potential solution to modeling complex reliability systems is using a hybrid of the first two methods. For example, one hybrid solution is implemented in the "Spar" software produced by Clockwork Solutions, Inc. of Austin, Tex. The Clockwork Solutions approach uses RBD modeling supplemented with a proprietary macro language that can be difficult to understand and use. Because the macro language tends to have a steep learning curve, many clients request Clockwork Solutions create customized models rather than customizing the models themselves. This can result in labor intensive models that may be high in direct and indirect costs. Furthermore, the extensive reliance on non-graphical modeling means results in hiding important model features from the user (such as dependencies among components' failures), which may adversely affect verification procedures and the compatibility with other reliability analyses. Despite all these drawbacks, the software is widely used because of the lack of viable alternatives for modeling the reliability of a large complex system.

Petri Net Extension Formalism

One other potential solution for modeling system reliability is the use of a Petri net extension. However, most of the available tools for Petri nets are limited to modeling stochastic processes governed by firing policies with an exponential distribution where memory issues are not addressed. The research related to handling aging systems is much more recent and limited in scope.

Petri nets have been used for over forty years to model processes. Although extensions to the basic Petri net have been developed, and are briefly described below, the essential components and behavior are essentially the same. A Petri net is a directed graph with two disjoint types of nodes: places (denoted as circles) and transitions (denoted as rectangles). A directed arc (an arc denoted as a line with an arrow), can connect a place to a transition or a transition to a place. A directed arc that connects a place to a transition is called an input arc, and a directed arc that connects a transition to a place is called an output arc. The places connected to a given transition by input or output arcs are called the input or output places, respectively, for this transition.

An arc from a place to a transition indicates that the transition requires one token in that place as one of the conditions for it to be enabled. However, in some extensions of the Petri net, arc multiplicities (integer numbers) can be specified as well. That is, the multiplicity of the arc denotes the number of tokens from that place that the transition requires to be enabled. These arcs are denoted with a "/" and an integer number representing the respective multiplicity.

Each place may be assigned a non-negative number of tokens (denoted as small, solid circles within a place). Thus, each place is capable of hosting zero or more assigned tokens. A combined assignment for all the places in the model is referred to as a marking of the system that fully characterizes the system. Changes in the system state are modeled by the tokens' movements that are realized from the transitions' "firing." The firing of a transition simultaneously accomplishes two actions: (1) it removes at least one token from its input places and (2) deposits at least one token to its output places. The quantities of removed and deposited tokens are equal to the multiplicities of the corresponding input and output arcs, respectively.

Generally speaking, the number of removed and deposited tokens does not have to coincide, and these two parts of firing can be considered as independent events corresponding to the "death" and "birth" of the tokens, respectively. However, a combination of a token's removal from an input place and a token's deposit into an output place for the same transition may also considered as a single action of moving the token from the input place to the output place. If all the tokens are indistinguishable, then both interpretations are equivalent.

For labeled tokens, the difference may be significant, since it allows the preservation of information stored in the label as the token moves from one place to another.

The firing of a transition can only occur when the transition is enabled. The first condition for a transition to be enabled is the requirement that each of the transition's input places have at least as many tokens as the multiplicity of the corresponding input arcs. However, some additional conditions on the system marking can be imposed as well (e.g., so-called "guards"), and the flexibility of these conditions depends on the Petri net extension. For example, one type of guard is an inhibitor arc (denoted as an arc terminated with a small hollow circle). Although an inhibitor arc does not increase the Petri net's representation power, inhibitor arcs can make the model more compact and understandable.

Thus, in the presence of inhibitor arcs, there is an additional condition for a transition to become enabled. Specifically, a transition having an inhibitor may be enabled only when all of the inhibitor input places for that transition have fewer numbers of tokens than the multiplicities of the corresponding inhibitor arc(s).

Original Petri nets did not maintain a concept of time. Rather, an enabled transition would fire instantaneously. However, Petri net extensions introduced deterministic time delays in which the firing of a transition occurs when a transition is enabled for a specified amount of time. These extensions led to timed Petri nets, and then were later extended to stochastic Petri nets in which the delays may be random variables based on given distributions.

In a standard stochastic Petri nets, when a transition is disabled, it "forgets" its previous enabled time. The time is reset when the transition is enabled again and the corresponding firing time is resampled. This memory policy is referred to as an "enabling memory" or a "preemptive repeat different" (prd) policy. In a second type of memory policy, a transition can "remember" the time that it was enabled. In effect, the transition's timer is stopped but not reset. This is called an "age memory" or a "preemptive resume" (prs) policy. Finally, using a third type of memory policy, a transition is configured such that the timer is reset, but no resampling is done and the same sampled time is used. This third memory policy is called a "preemptive repeat identical" (pri) policy.

Another extension, referred to as a "colored" Petri net extension, uses colored tokens to identify the token. The firing policy of the transition can be affected by the color of the token. This concept is quite different from standard Petri nets which treat the tokens as fungible objects which are not identified. The tokens in a colored Petri net may change with a change in marking, such as, upon firing of a transition. Thus, a token in a colored Petri net does not carry any information about the duration the token stays at a particular place. Additionally, since the labels (colors) that can affect firing policies can only change in a discrete fashion when a token is moved from one location to another, the properties of the token stay the same so long as the token remains in the same place.

Accordingly, prior art Petri net modeling systems use memory-enabled transitions, which can be an efficient way to model certain types of systems. However, because prior art standard Petri nets (including any extensions thereof), do not have a simple way to track the age, or other relevant property, of a part (which degrades) in a complex system, prior art Petri nets are not efficient for modeling the reliability and performability of a system.

U.S. patent application Ser. No. 10/043,712 (now U.S. Pat. No. 7,006,947) entitled "Method and Apparatus for Predicting Failure in a System," and U.S. Pat. No. 6,321,187 entitled "System Reliability Assessment Tool" cover various aspects of system reliability, but do not mention the use of Petri nets. At the same time, several patents are apparently devoted to various applications of Petri nets, but are not related specifically to systems reliability. For example, U.S. Pat. No. 6,185,469 entitled "Method and Apparatus for Testing and Controlling a Flexible Manufacturing System," U.S. Pat. No. 6,363,494 entitled "System and Method for Characterizing and Repairing Intelligent Systems," and U.S. Pat. No. 6,067,357 entitled "Telephony Call-Center Scripting by Petri Net Principles and Techniques." Furthermore, an application of colored Petri nets is described in U.S. Pat. No. 5,257,363 entitled "Computer Aided Generation of Programs Modeling Complex Systems Using Colored Petri Nets," which describes an implementation of a colored Petri nets as applied to solving a specific problem. However, each of these works rely on existing Petri nets, and extensions of Petri nets, to apply their respective solutions.

Thus, what is needed is a Petri net extension which can more efficiently apply the Petri net formalism to applications in which time accumulation affects a system's behavior, such as, but not limited to: probabilistic risk assessment and modeling system reliability, safety, and security, modeling the spread of viruses and infectious diseases. For example, in the context of epidemiological modeling, a token can represent an individual, with different places corresponding to various states of his or her health as well as any contacts with other individuals and/or medication effects. Then aging tokens can represent the individual's life expectancy or the time since the decease has been contracted. Without the use of aging tokens such information would be lost as soon as the token moves to a new place, which would severely limit the use of token's movements.

SUMMARY

Systems and methods of modeling of complex dynamic systems are disclosed. One embodiment of a method for modeling a system, among others, comprises graphically representing at least one state of the system with at least one directed graph. The directed graph includes an aging token, a first place and a second place capable of hosting the aging token, a transition for moving the aging token from the first place to the second place, and at least one directed arc for connecting either of the first place and the second place to the transition. The method may further include assigning at least one value to the aging token, the value capable of being updated while the aging token resides in either of the first or second place.

Another embodiment, directed to a modeling system, includes a construction module for building a graphical representation of at least one state of the system with at least one directed graph. The directed graph may comprise a first place and a second place; an aging token having at least one value capable of being updated while the aging token resides in either of the first or second place; a transition for moving the aging token from the first place to the second place; and at least one directed arc for connecting either of the first place and the second place to the transition.

Another embodiment comprises a first code segment for graphically representing at least one state of the system with at least one directed graph. The at least one directed graph comprises an aging token, a first place and a second place capable of hosting the aging token, a transition for moving the aging token from the first place to the second place, and at least one directed arc for connecting either of the first place and the second place to the transition. The embodiment may further comprise a second code segment for assigning at least one value to the aging token, the value capable of being updated while the token resides in either of the first or the second place.

Other systems, methods, features and/or advantages will be, or may become, apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The components in the drawings are not necessarily to scale relative to each other. Like reference numerals designate corresponding parts throughout the several views.

DETAILED DESCRIPTION

Systems and methods of modeling of complex dynamic systems with properties that are non-uniform in the time domain are disclosed. Such systems track the age of a system as a whole as well as its individual constituents.

Specifically, a Petri net extension is disclosed that efficiently applies the Petri net formalism to applications in which time accumulation affects a system's behavior (e.g. modeling systems reliability, tracking the spread of an infectious disease, etc.). The extension introduces the concept of aging tokens, or tokens with memory, in the context of stochastic Petri nets, to more efficiently address modeling applications in which time accumulation affects a system's behavior.

The resulting extended framework provides for uniquely flexible and transparent graphical modeling with excellent representational power that is particularly suited for, but not limited to, dependability and performability modeling of complex systems (e.g. including, but not limited to, large-scale non-deterministic repairable, redundant, and reconfiguring systems).

Figure 1:
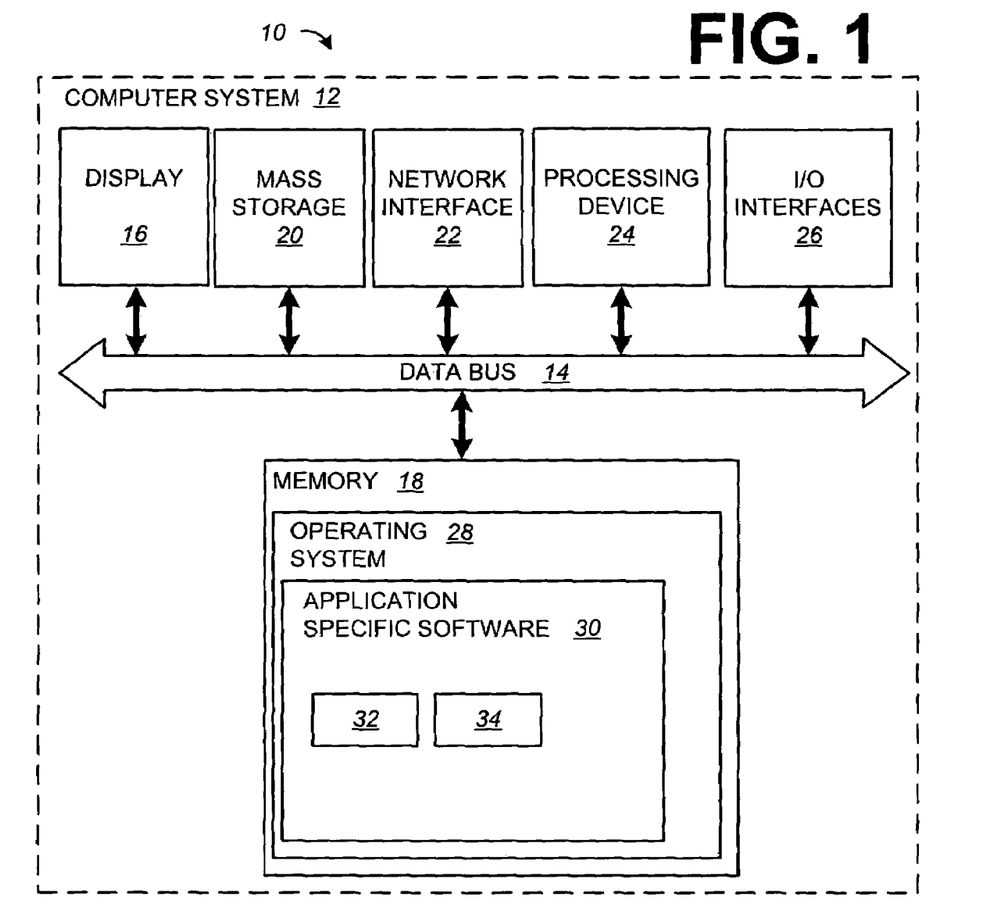
FIG. 1 depicts a block diagram of an embodiment of an exemplary modeling system which may be used to implement a stochastic Petri net using aging tokens.

FIG. 1 depicts a block diagram illustrating an exemplary embodiment of a modeling system 10. The modeling system 10 may comprise a computer system 12 which may be programmed, or otherwise configured, to implement the described stochastic Petri net extension using aging tokens. Generally speaking, the computer system 12 can comprise any one of a wide variety of wired and/or wireless computing devices, such as a desktop computer, portable computer, dedicated server computer, multiprocessor computing device, cellular telephone, personal digital assistant (PDA), handheld or pen based computer, embedded appliance and so forth. Irrespective of its specific arrangement, computer system 12 can, for instance, comprise a bus 14 which may connect a display 16, memory 18, mass storage device 20, network interface 22, processing device 24, and an input/output interface 26.

Processing device 24 can include any custom made or commercially available processor, a central processing unit (CPU) or an auxiliary processor among several processors associated with the computer system 12, a semiconductor based microprocessor (in the form of a microchip), a macroprocessor, one or more application specific integrated circuits (ASICs), a plurality of suitably configured digital logic gates, and other well known electrical configurations comprising discrete elements both individually and in various combinations to coordinate the overall operation of the computing system.

The memory 18 can include any one of a combination of volatile memory elements (e.g., random-access memory (RAM, such as DRAM, and SRAM, etc.)) and nonvolatile memory elements (e.g., ROM, hard drive, tape, CDROM, etc.). The memory 18 typically comprises a native operating system 28, one or more native applications, emulation systems, or emulated applications for any of a variety of operating systems and/or emulated hardware platforms, emulated operating systems, etc.

For example, the applications may include application specific software 30, which may include a number of executable modules therein. For example, some embodiments may include a construction module 32 for constructing a stochastic Petri nets having aging tokens. Construction module 32, for example, may implement graphical tools for linking places, transitions, and tokens such that the resulting modeled system can be simulated. The resulting modeled system may be constructed and displayed within a graphical user interface on display 16. Likewise, the application specific software 30 may include at least one simulation module 34 for simulating the modeled system.

Memory 18 may further include a number of other executable modules which, for example, could be sub-modules of construction module 32 and simulation module 34. One of ordinary skill in the art will appreciate that memory 18 can, and typically will, comprise other components which have been omitted for purposes of brevity.

Input/output interfaces 26 provide any number of interfaces for the input and output of data. For example, where the computer system 12 comprises a personal computer, these components may interface with a user input device (not shown), which may be a keyboard or a mouse. Where the computer system 12 comprises a handheld device (e.g., PDA, mobile telephone), these components may interface with function keys or buttons, a touch sensitive screen, a stylist, etc. Display 16 can comprise a computer monitor or a plasma screen for a PC or a liquid crystal display (LCD) on a hand held device, for example.

With further reference to FIG. 1, network interface device 22 comprises various components used to transmit and/or receive data over a network. By way of example, the network interface device 22 may include a device that can communicate with both inputs and outputs, for instance, a modulator/demodulator (e.g., a modem), wireless (e.g., radio frequency (RF)) transceiver, a telephonic interface, a bridge, a router, network card, etc.)

In the context of this document, a "computer-readable medium" can be essentially anything that can store, communicate, or transport the executable modules for use by, or in connection with, the instruction execution system, apparatus, or device. The computer readable medium can be, for example, but not limited to, an electronic, magnetic, optical, electromagnetic, infrared, or semiconductor system, apparatus, or device. More specific examples (a nonexhaustive list) of the computer-readable medium would include the following: a portable computer diskette (magnetic), a random access memory (RAM) (electronic), a read-only memory (ROM) (electronic), an erasable programmable read-only memory (EPROM, EEPROM, or Flash memory) (electronic), and a portable compact disc read-only memory (CDROM) (optical). Note that the computer-readable medium could even be paper or another suitable medium upon which the program is printed, as the program can be electronically captured, via optical scanning of the paper or other medium, then compiled, interpreted or otherwise processed in a suitable manner if necessary, and then stored in a computer memory.

Figure 2:
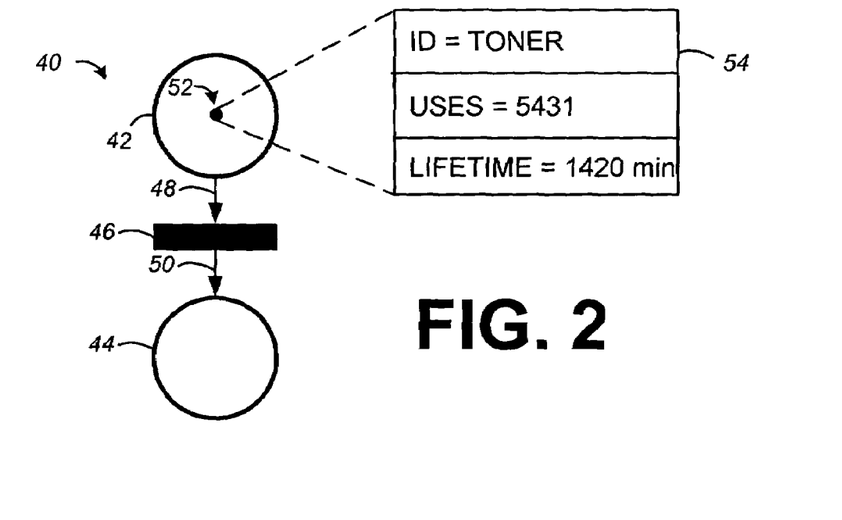
FIG. 2 depicts a block diagram of an embodiment of an exemplary Petri net using an aging token which may be constructed and used to simulate and assess the reliability and performability of a complex system using the modeling system of FIG. 1.

Looking now to FIG. 2, an exemplary Petri net 40 which may be modeled using computer system 12 using the described Petri net extension (e.g. using construction module 32 and simulation module 34 ) is illustrated. Petri net 40 includes places 42 and 44, transition 46, input arc 48, and output arc 50. In contrast to existing Petri nets, the present Petri net extension introduces tokens with memory, which may also be referred to as aging tokens. Accordingly, Petri net 40 also includes aging token 52 which may include any number of associated tags and values. These values may be updated during simulation. For example, if the value is a number, the value may numerically increment or decrement according to a counter associated with either the token-or a transition enabled by the token. In the present example, these values are represented within chart 54, which includes an identification value (ID), a uses value (USES), and a lifetime count value (LIFETIME). However, it should be understooed that the types of values stored with the token may be different depending on the type of system being modeled. Although embodiments described herein may use numeric values, the value could also be, but is not limited to, a number, an alphanumeric character, a color, or a graphical symbol.

In some embodiments, a value associated with an aging token may be a real number between 0 and 1, indicating the fraction of the lifespan of a part that was spent or used. The value may indicate the actual time that the token was enabling a transition, to facilitate the modeling of accumulated damage, human fatigue, as well as virus incubation, or, on the contrary, a learning process associated with improved properties. At the same time, another value may be a traditional colored label, which may be an integer that indicates the number of repairs for the part. These dynamic features are only possible when a token can be "preserved" by a transition and both parts of firing (removing and depositing) are treated as parts of a single action: moving the aging token from an input to an output place.

Accordingly, Petri net 40 may, for example, model the use of a toner cartridge in a laser printer. The ID value in chart 54 may identify a particular token which represents a part in a system (here, "TONER"). Although the exemplary value, "TONER," is alphanumeric, the ID could be a color or any other symbol or identifying label. The ID label, for example, could be similar to those used in colored Petri nets, and may be static or only capable of changing its value upon moving across a transition. The USES value may, for example, identify the number of times a part (e.g. the toner cartridge) in the system has been used, and the value could be incremented during the enabling of transition 48. In some embodiments, the USES value may decrement from a predetermined value representing a fixed lifespan. In the present example, the USES value of "5431" may represent a total number of sheets of paper printed using the printer cartridge. The LIFETIME value may, for example, identify the amount of time a part has been in use. For example, the counter could increment the value (or decrement) in seconds, hours, days, or years. In the present example, the LIFETIME value of "1420 min" may represent the total time elapsed during printing of the 5431 sheets of paper. Of course, the above are merely examples, and any number of tags and values could be stored in table 54.

Accordingly, unlike standard stochastic Petri nets, which assign memory to the transitions, the present extension of stochastic Petri nets is capable of assigning memory to a token instead. Additionally, unlike existing color Petri nets, the token labels affecting firing policies are time-dependent (i.e., the value of these labels can change in the process of the simulation without any change of token's position).

To this end, an aging token may include at least one associated value, and the values may change during the simulation, while the aging token resides within the same place. The aging of a token may occur when an aging token enables a transition that has a matching firing policy for the token. Thus, a particular transition may not have a matching firing policy for some tokens. At any given marking, an aging token can enable, at most, one transition with a matching firing policy, per value associated with the token, in order to define the "aging" of this value in a unique fashion. However, in addition, the token can also enable an arbitrary number of transitions that do not affect the age (value) of the token.

Additionally, the values associated with the aging tokens have the ability to affect the firing policies of transitions that are enabled by the aging tokens. For example, the transition can be configured to fire only if the counter reaches a certain value, or the transition could actually fire sooner or later, for example, depending on the values of the tokens. Thus, the term "aging policy" determines how the token's label changes in time, and the "firing policy" determines whether and when the particular token is fired by a transition given the label's value (thus, the firing occurrence can depend on that value).

Accordingly, as shown in the example of FIG. 2, there may be a plurality of values associated with a given aging token. Additionally, it is possible to combine aging tokens, which may include continuously changing labels, with tokens used in colored Petri nets, which have discretely changing labels that change only upon moving to a new place. In some embodiments of the present Petri nets using aging tokens, the aging tokens could also be discretely changed as well. For example, the aging tokens may be discretely changed when the elapsed time measures in discrete units.

Ambiguities should be avoided if multiple inputs and output places and/or arc multiplicities are present: the route of all the tokens that are "preserved" by the transition should be uniquely specified by matching (labeling) corresponding output and input arcs. A "death" or a "birth" of an aging token can still occur, similar to non-aging tokens.

The use of aging tokens in Petri nets can be viewed as a fundamental change in how a Petri net is perceived and used. Specifically, traditional stochastic Petri nets generally correspond to discrete changes in the system's state (i.e., events), while the aging tokens of the present Petri net extension provide modeling of a continuous change in the system's state (i.e., processes).

In order to take full advantage of aging tokens, it is useful to distinguish several modes of firing which form part of the transitions firing policy for a given timed transition (stochastic or deterministic):

Standard Mode

The standard mode of firing is the mode used in uncolored Petri nets. Using the standard mode of firing, once the transition is enabled, a stochastic distribution is sampled or a deterministic delay is provided, and an associated single clock starts. When this clock runs down, the transition fires a number of tokens that is equal to the multiplicity of the corresponding output arc. Tokens are chosen at random from the input place. The procedure is repeated as long as the transition remains enabled.

Series Mode (First-In-First-Out)

The series mode of firing, which is also known as first-in-first-out (FIFO) mode, is similar to standard mode in that only one clock per transition is active at any given point in time. However, tokens are fired in the order they arrive in the input place. The distinction between FIFO and standard mode is relevant only for labeled tokens since non-labeled tokens are fungible. Series mode of firing is sometimes used in colored Petri nets.

Multiple Mode (Parallel)

The multiple mode of firing is the mode commonly used in colored Petri nets, and is also adopted for use with the described systems using Petri nets having aging tokens. Multiple mode, which is also known as parallel mode, may be useful for a more compact description of similar processes. For each token in an input place, the firing delay is determined independently, and a corresponding separate clock is assigned. The fundamental distinction of this mode from the standard and FIFO modes is that the firing policies of the transitions are intimately related to properties of both the token and the transition. Because the firing policy relates to both the token and the transition, an analogy with a key (token) and a lock (transition) can be made.

In multiple mode, both multiple arcs for standard transitions and multiple transitions may be designed to engage several tokens at the same time. However, the multiple arc essentially lumps tokens into a single packet that is fired as a single token, while the multiple transition preserves the individuality of each token. For clarity purposes, in the present formulation of a multiple mode arc, multiplicity affects only the enabling, and not the firing, of the transition.

Multiple mode transitions are commonly used in stochastic Petri nets with aging tokens, in part because multiple mode transitions can also be used to mimic the behavior of the series and standard modes. For example, FIGS. 3A and 3B depict a comparison of a stochastic Petri net representation 60 and 78 using a series mode transition 62 and multiple mode transition 80, respectively.

Figures 3A, 3B, 4A, 4B:
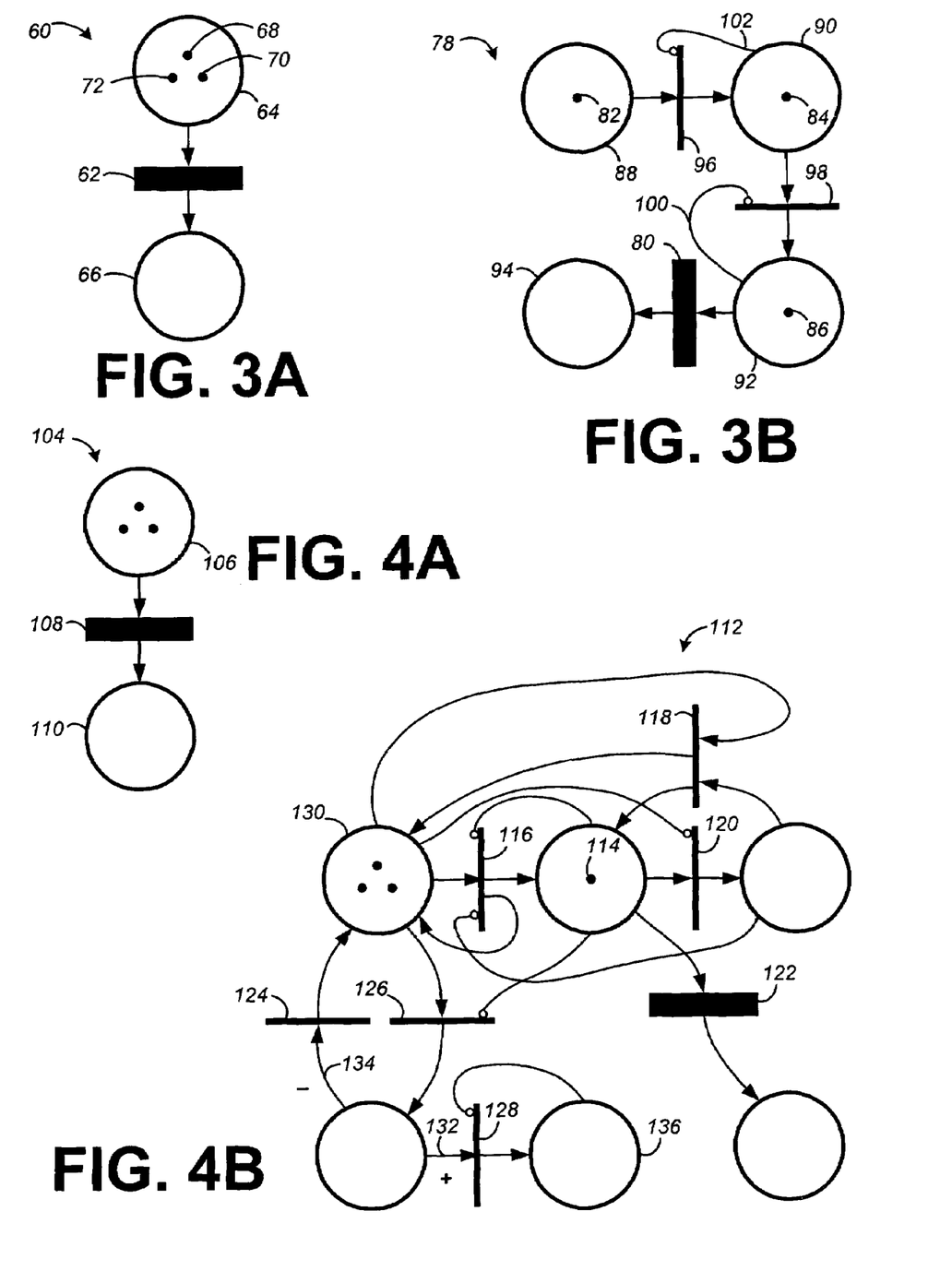
FIG. 3A depicts a block diagram of a stochastic Petri net representation using a series mode transition, which may be constructed and used to simulate and assess the reliability and performability of a complex system using the modeling system of FIG. 1.
FIG. 3B depicts a block diagram of a stochastic Petri net representation using a multiple mode transition, which may be constructed and used to simulate and assess the reliability and performability of a complex system using the modeling system of FIG. 1.
FIG. 4A depicts a block diagram of a stochastic Petri net representation using series transition, which may be constructed and used to simulate and assess the reliability and performability of a complex system using the modeling system of FIG. 1.
FIG. 4B depicts a block diagram of a stochastic Petri net, equivalent to the representation of FIG. 4A, using multiple mode transitions instead of series mode transitions.

Looking specifically to FIG. 3A, the Petri net using series mode transition 62 moves each of the three tokens 68, 70, and 72 from input place 64, to output place 66 in the order they arrive in the input place 64. Similarly, looking specifically to FIG. 3B, a Petri net using multiple mode transition 80 moves each of the three tokens 82, 84, and 86 from their respective start places 88, 90, and 92, to output place 94. Transitions 96 and 98 are of the immediate type (e.g. they fire immediately upon enabling). Multiple transition 80, which is denoted as a thicker rectangle than the rectangles representing transitions 96 and 98, is of the multiple type. Thus, inhibitors 100 and 102 ensure that transitions 96 and 98 do not fire until a token is not present in their respective places 90 and 92. Although the Petri net using multiple mode transition (FIG. 3B) can effectively model the same system of the Petri net using series mode transition (FIG. 3A), the Petri net using series mode transition provides a more compact representation. This observation is especially true when the input place (e.g. FIG. 3A, 64 and FIG. 3B, 88) is an input to other transitions as well.

FIGS. 4A and 4B depict a comparison of a stochastic Petri net representation 104 and 112 using standard mode transitions and multiple mode transitions, respectively. As can be deduced from a comparison of FIGS. 4A and 4B, representing standard mode transitions using multiple mode transitions is seemingly more cumbersome than representing series mode transitions using multiple mode transitions. Effectively, the difficulty stems from the need to remove the influence of token properties on the firing policy of the transition. A token that enables a standard mode transition need not even be present when the transition is fired. This "token-neutral" firing can be accomplished using multiple mode transitions with the assistance of introducing an auxiliary token 114.

FIG. 4A depicts a series transition 108, which is capable of moving the three tokens located at input place 106 to the output place 110. FIG. 4B depicts a modeling of the equivalent Petri net using multiple mode transitions to move the three tokens located at input place 130 to output place 136. Of the seven transitions 116, 118, 120, 122, 124, 126, and 128, only transition 122 is a multiple mode transition with all others being of the immediate type. As soon as a token appears at start place 130 for the first time, transition 116 immediately fires. All the tokens from start place 130 are returned back to start place 130. However, in addition, auxiliary token 114 is "born," which enables transition 122, which has the same timing properties as transition 108 in FIG. 4.

As depicted in FIG. 4B, the inhibitors of Petri net 112 are arranged such that if all tokens are removed from start place 130, then transition 120 is fired. Once transition 120 is fired, transition 122 is disabled. Conversely, if a token is moved to start place 130, the auxiliary token 114 is fired back via transition 118 and transition 122 is enabled again. The firing of transition 122 causes all the tokens from start place 130 to be fired and enable transition 124 and 128. Since transition 128 has a higher priority than transition 124 (corresponding arc 132 is denoted with a "+", whereas arc 134 to transition 124 is denoted with a "−"), it fires a randomly chosen token to output place 136. All other tokens are returned to input place 130 via transition 124, a new auxiliary token 114 is "born" and the clock for transition 122 is restarted.

The use of non-aging auxiliary tokens is equivalent to a prd policy for a standard transition, while aging auxiliary tokens can mimic prs policy. Furthermore, pri policy can be modeled using the same diagram as well by assigning transition 122 a deterministic delay, $t_L = t_{max} + \epsilon$, where $t_{max}$ is the upper time limit of the model and $\epsilon$ is an arbitrary small delay. The stochastic nature of the firing of transition 122 is reflected in the initial age of the auxiliary token 114. If F(t) is a Cumulative Distribution Function (CDF) of the pri policy, then the following CDF for the age of the auxiliary token 114 can be given:

$$\hat{F}(x) = \begin{cases} 1 - F(t_L[1-x]), & \text{when } x \geq 0 \\ 0, & \text{when } x < 0 \end{cases} \quad \text{(Equation 1)}$$

For immediate transitions the concept of a clock is irrelevant, and if several tokens enable an immediate transition simultaneously, the fired token is chosen at random and the arc multiplicities have the standard meaning. However, transition priorities may be introduced in these situations as well, for example, based on token colors and/or labels.

Introducing aging tokens into Petri-net formalism has important ramifications for system reliability modeling of aging and repairable systems. Several salient features of real-life systems can be modeled more transparently. These systems include aging systems with load sharing, warm spares, multi-phase missions, and imperfect repair of pooled parts. In conjunction with the features that already exist in Petri nets, this provides a very powerful tool for modeling system reliability.

Example Systems Modeled With Stochastic Petri Nets With Aging Tokens

As discussed above, previous Petri net formulations (those not using aging tokens) associate memory solely with a transition, which results in significant difficulties in modeling the changes in the system configuration while preserving the memory. In such a setting, the changes in the damage accumulation, such as in multi-phase missions or shared loads, must be accommodated by "marking dependent" firing policies. This implies that a firing policy can change if the marking changes elsewhere in the model. However, there is no accepted way to express such dependence in a graphical way, and therefore it is described using external logic. For example, a Petri net without aging tokens may have additional rules associated with the transitions that are specified elsewhere, for example, in a formula-like fashion. As a result, the visual clarity of the modeling is compromised.

It is important to note that such difficulties are fundamental. If an event occurs that changes the properties of a given component, then in accordance with the spirit of Petri net modeling, such an event is best described by a corresponding token moving from one place to another. However, in standard Petri nets, a move of a token results in memory loss since the memory is associated with a transition, and once the token moves to a new place there is no mechanism to associate aging with the component that the token represents.

To demonstrate the advantages of the present system over standard Petri nets, several examples of the application of the proposed formalism using aging tokens are provided for comparison with existing methodologies.

EXAMPLE A

Repairable System With Warm Spares

Figure 5:
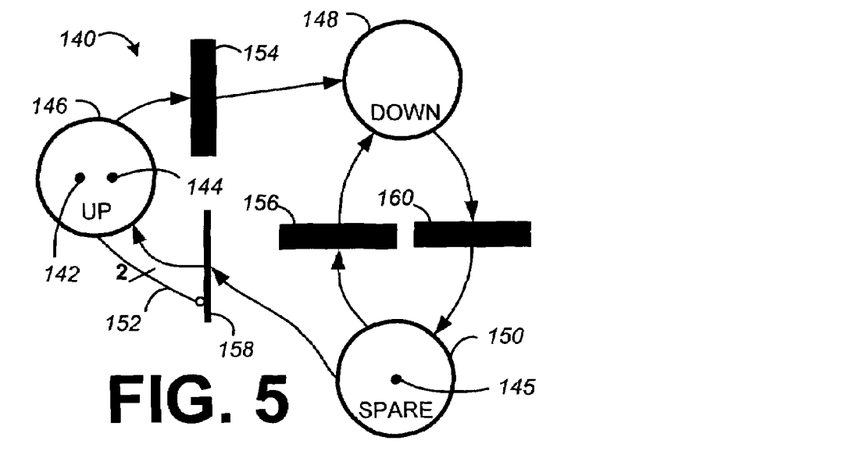
FIG. 5 depicts a block diagram of a repairable system with warm spares modeled by a stochastic Petri net with aging tokens, which may be constructed and used to simulate and assess the reliability and performability of a complex system using the modeling system of FIG. 1.

FIG. 5 depicts a representation of a repairable system 140 with warm spares modeled by a stochastic Petri net with aging tokens. A system having a "warm spare" describes a system having a standby unit that can fail, but for which the corresponding failure distribution is different from that of an active component. The following example models a repairable system with two active units (e.g. parts in a system) and a "warm spare" unit. For example, the units may represent the memory chips connected to a bus in a computer, or individual batteries used to supply power to a device, or even tires on a car (with a spare).

If the transition rates are constant, a system having a warm spare may be modeled in prior art systems using Markov chains. However, to model the case in which all three components are different, the Markov chain for this system requires eighteen states and thirty-six arcs. To model the case in which all three components are identical, four states are required to model the system.

However, as depicted in FIG. 5, using a stochastic Petri Net using aging tokens, the model is much simpler and easier to read. In the example of FIG. 5, the system is considered to be "down" (e.g. unusable) if fewer than two units are operating. Even if only one operating unit remains, the remaining operating unit can still fail.

Each unit, which may also be referred to as a component, object, or part of the system, is represented by tokens 142, 144, and 145. Each of the three possible states (UP, DOWN, and SPARE) for each unit is represented by a corresponding place 146, 148, and 150. Initially, tokens 142 and 144 are located in the "UP" place 146. Because of inhibitor 152, which has a multiplicity of two, an immediate firing of tokens 145 from the "SPARE" place 150 to the "UP" place 146 is prevented.

The failure of an operating or spare unit is modeled by two appropriate timed multiple transitions 154 and 156 to the "DOWN" place 148. Once any of the two active components fails, the "activation" transition 158 (an immediate type transition) becomes enabled and token 145, corresponding to the spare unit, moves to "UP" place 146, assuming that a spare is available.

Depending on the choice of the type of the repair transition 160, different repair policies can be modeled. For example, a series type is equivalent to a single (first-in-first-out) repair team, while a multiple mode transition models unlimited repair recourses. Additionally, although repairable system 140 describes a system having 3 units, with 2 units active, the model remains correct for the general case in which k out of n units are required for system's functioning (which implies that k units must be active at any given point to avoid system failure), as long as the tokens are added and the arc multiplicity is adjusted.

For a system with more units the advantages of using a stochastic Petri net with aging tokens over using Markov models is even more striking. One potential advantage of stochastic Petri nets is local modeling. That is, only the combined marking of all the places characterizes the system. In contrast, a Markov model is that of a global kind, and any local change in the system corresponds to a different global Markov state.

A direct consequence of this difference is that Markov chains use a global (explicit) logical branching in which all the logical permutations are specified up front. In contrast, stochastic Petri nets use local (implicit) logical rules, which results in more compact models when the problem sizes increases.

In the case that the system 140 of FIG. 5 is modeled with non-exponential transitional rates, Markov chains are not directly applicable. Specifically, using Markov chains, damage can accumulate in two different transitions (specifically, the spare and active failures), and therefore the modeling with prs transitions is far from straightforward, if not impossible. One solution using Markov chains may include merging the "UP" and the "SPARE" places, and modeling the transitions from the "SPARE" to the "UP" state for each component by implementing an elaborate marking dependence. However, this solution loses the visual clarity that the original non-aging model possesses.

Unlike Markov chains, the introduction of aging tokens permits modeling of the aging of system without marking dependence. In fact, the visual representation of the model stays the same using aging tokens. In a system model using aging tokens, each token may be assigned a label that records the component's age, $A_y$, (see, for example, table 54 of FIG. 2). Assuming that at $t=t_0$ the component is new $A_y(t_0)=0$, while $F_a$ and $F_s$ are CDFs corresponding to the firing policies of active and spare failures, respectively. Further, if one of the active units fails first at $t_1$, then a token corresponding to a spare component moves to the "UP" place 146, and its age $A_3 = F_s(t_1)$ is used to calculate an equivalent starting time, $t_s = F_a^{-1}(A_3)$, which then is used to sample $F_a$.

EXAMPLE B

Load Sharing

Figure 6:
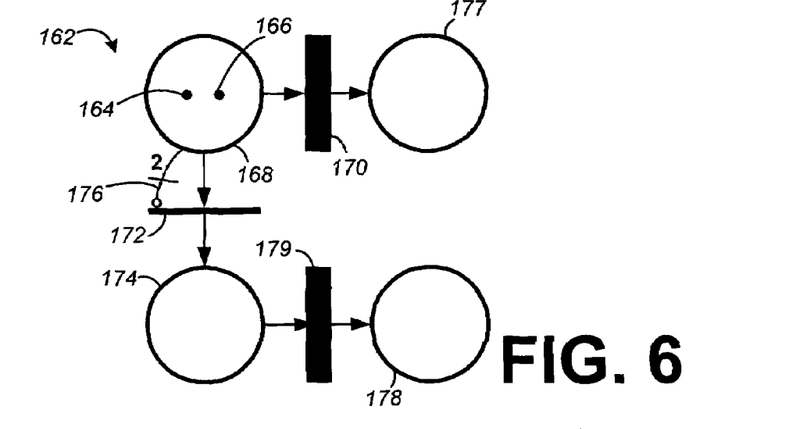
FIG. 6 depicts a block diagram of a load sharing subsystem with warm spares modeled by a stochastic Petri net with aging tokens, which may be constructed and used to simulate and assess the reliability and performability of a complex system using the modeling system of FIG. 1.

FIG. 6 provides an illustration of a load sharing subsystem 162 modeled using a system implementing the proposed Petri net extension using aging tokens. Load sharing is a very common phenomenon in which failure of a part does not cause an immediate system failure, but increases the chances for another part's failure. For example, a floor in a building is commonly supported by a number of columns which distribute the load caused by the weight of the floor. If a single column supporting the floor fails, the load is redistributed to the other columns. Thus, the remaining columns carry more weight and, as a result, will fail faster. Similarly, an equivalent load sharing system can be modeled of a group of snipers defending a strategic position. If one of the snipers is disabled (e.g. shot), the chance for each of the remaining snipers to be disabled by the offensive forces increases.

In this system, two parts (represented by tokens 164 and 166) with an aging failure distribution (e.g., Weibull) share a common load. Thus, each of tokens 164 and 166 include an associated value representing the use, age, or degradation of a corresponding part (see, for example, table 54 of FIG. 2), and the value may be incremented when enabling a transition having a matching aging policy. For example, the value may correspond to an elapsed time that the corresponding part is active.

Initially, the two parts are in an undamaged state, so the two corresponding tokens 164 and 166 are in place 168. Both of tokens 164 and 166 enable transition 170 that has matching, and possibly different, aging policies for each of tokens 164 and 166. That is, each of tokens 164 and 166 may have a different aging policy in that, for example, the corresponding parts may fail at different rates.

A second transition 172, which is of the immediate type, located between place 168 and place 174, is disabled due to the presence of inhibitor 176, which has a multiplicity of two.

Once one of the parts fails, the corresponding token (one of tokens 164 and 166 ) moves to place 177. Once the corresponding token moves to place 177, transition 172 is enabled and fires immediately. Therefore transition 172 moves the other of tokens 164 and 166 (corresponding to the still-operating part) into place 174.

Once the token corresponding to the still-operating part moves into place 174, transition 179 is enabled having a matching (and faster) aging policy; representing the situation that the load is being completely carried by the single operating part. The amount of damage that the token representing the still-operating part accumulated while staying in place 168 is retained even after moving to place 174 and the value can be used to determine the firing time based on the distribution for transition 179. Accordingly, the firing policy of transition 179, along with the accumulated damage, or any other measure of part usage, are used to determine when the transition fires and the token is moved from place 174 (representing one operating part) to place 178 (representing no operating parts).

Load sharing models need not be restricted to time scaling, as is commonly done in modeling multiphase changes in loads (when the effects of changing loads are modeled by changing the clock speed), and more rigorous modeling based on the equivalent time may be implemented instead.

If a load sharing subsystem were implemented in a stochastic Petri net without aging tokens, the graphical representation would consist of only of the top part of FIG. 6 (states 168 and 177, transition 170, the corresponding arcs, and two non-aging tokens). Accordingly, many of the important features of the system would not be capable of being modeled graphically. Instead, the definition of the firing policy for transition 170 would include a statement to the effect that if a token is marked in state 177 (one of the two parts has failed) then the firing policy of transition 170 changes. Not only does the visual representation suffer when using non-aging tokens, changing the firing policy of a transition further complicates this situation since, for aging parts, such a change would also depend on when the second part fails. Similar modeling problems exist in multiphase systems, which are explored in more detail below.

EXAMPLE C

Multiphase Missions

Figure 7:
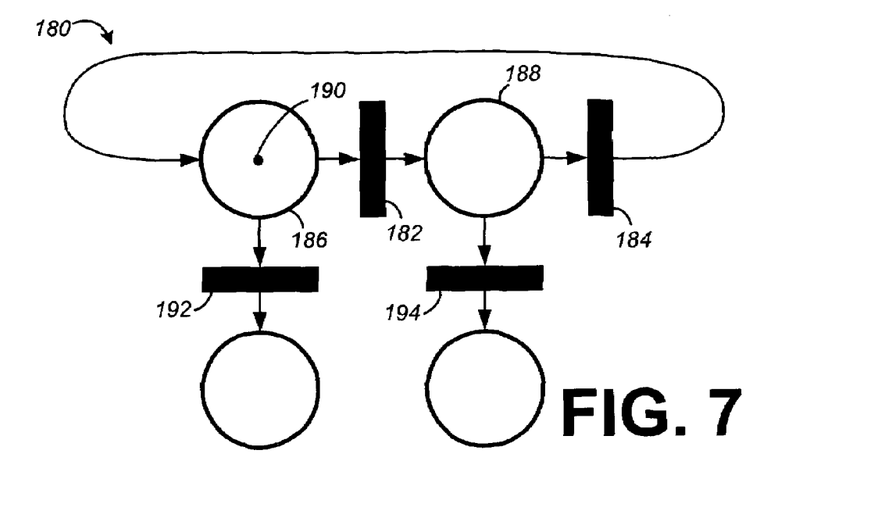
FIG. 7 depicts a block diagram of an aging part undergoing a two-phase periodic mission modeled by a stochastic Petri net with aging tokens, which may be constructed and used to simulate and assess the reliability and performability of a complex system using the modeling system of FIG. 1.

FIG. 7 depicts a system 180 illustrating an aging part undergoing a two-phase periodic mission modeled using the proposed Petri net extension using aging tokens. For example, modeling of a two-phase periodic mission may be used to describe changes in operating conditions. For example, the season (winter/summer or wet/dry) can affect the rate of corrosion for a metal truss on a bridge. Transitions 182 and 184 determine the duration of phase I (place 186) and phase II (place 188), respectively. The durations of the phases can be either deterministic or nondeterministic. During each phase the part, represented by token 190, can fail. Specifically, token 190 includes a value representing, for example, the use, age, or degradation of the corresponding part (see, for example, table 54 of FIG. 2), which may be updated when enabling a transition having a matching aging policy. Accordingly, the part failure corresponds to the firing of the transition 192 or 194, respectively. In this example, transitions 192 and 194 have aging policies for token 190, but transitions 182 and 184 do not.

EXAMPLE D

Pooled Repair

Figure 8:
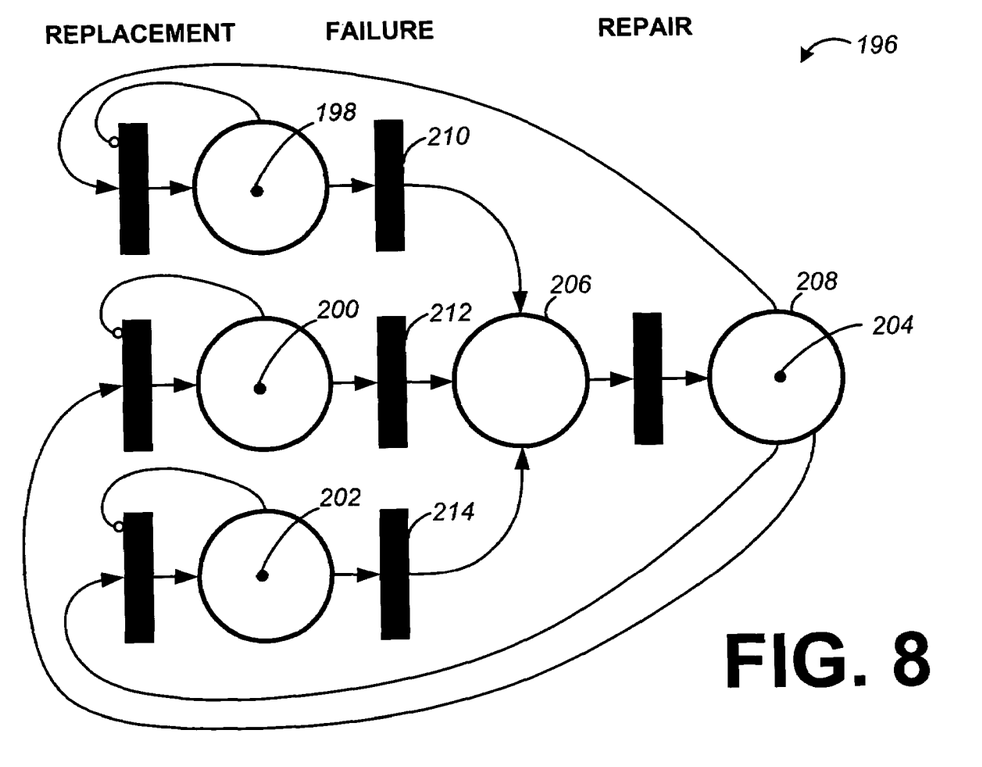
FIG. 8 depicts a block diagram of a system implementing pooled repair modeled by a stochastic Petri net with aging tokens, which may be constructed and used to simulate and assess the reliability and performability of a complex system using the modeling system of FIG. 1.

FIG. 8 depicts a system 196 illustrating a fleet of three similar units sharing a pool of spares, modeled using the proposed Petri net extension using aging tokens. For example, a pooled repair system may model a fleet of gas turbines, with the repairable part being a first stage blade, or it could also model the hub of a delivery company (e.g. the United States Postal Service, FedEx, or the United Parcel Service), with the reparable unit being a delivery truck, for example.

Three sets of transitions, labeled as "REPLACEMENT," "FAILURE," and "REPAIR," are used to fire the tokens based on an appropriate distribution. According to this simulation, if one of three parts (represented by tokens 198, 200, 202) fails, a spare (represented by token 204), from the pool is used, if available. The failed part is sent for repairs at place 206. When repaired, the failed part is added to the pool of spares, represented by place 208.

If the repair restores the part to its pristine, "like-new" state, such a situation is modeled in standard stochastic Petri nets, without aging tokens, with little difficulty. However, such an assumption is unrealistically optimistic for many systems. Rather, a "minimal repair" methodology is commonly used in reliability models. Specifically, rather than repairing the part to a pristine "like-new" state, the part is repaired to the state where it was just before failure.

In the embodiment of FIG. 8, only failure transitions 210, 212, and 214 have matching aging policies for the tokens associated with them. A value associated with each token holds the age of the part it represents. The age of the part stored in the value could be measured in time units or uses, for example, as depicted in table 54 of FIG. 2. The value associated with the token is used to sample the corresponding failure distribution.

More sophisticated policies of repair can be modeled with a Petri net extension using aging tokens as well. For example, a repair count for a token can be activated, and a transition policy could be configured such that only a limited number of repairs are allowed before the part is moved to a discard place (not shown), rather than repair place 206. Even such a relatively simple situation presents formidable challenges for modeling using high-level Petri nets without aging tokens. Using memory-enabled transitions, rather than aging tokens, once the part fails, the corresponding transition fires. Thus, even if a memory enabled transition preserves the age, keeping the track of all possible combinations is not practical because a different part can replace the failed unit.

EXAMPLE E

Multimission System

Figure 9:
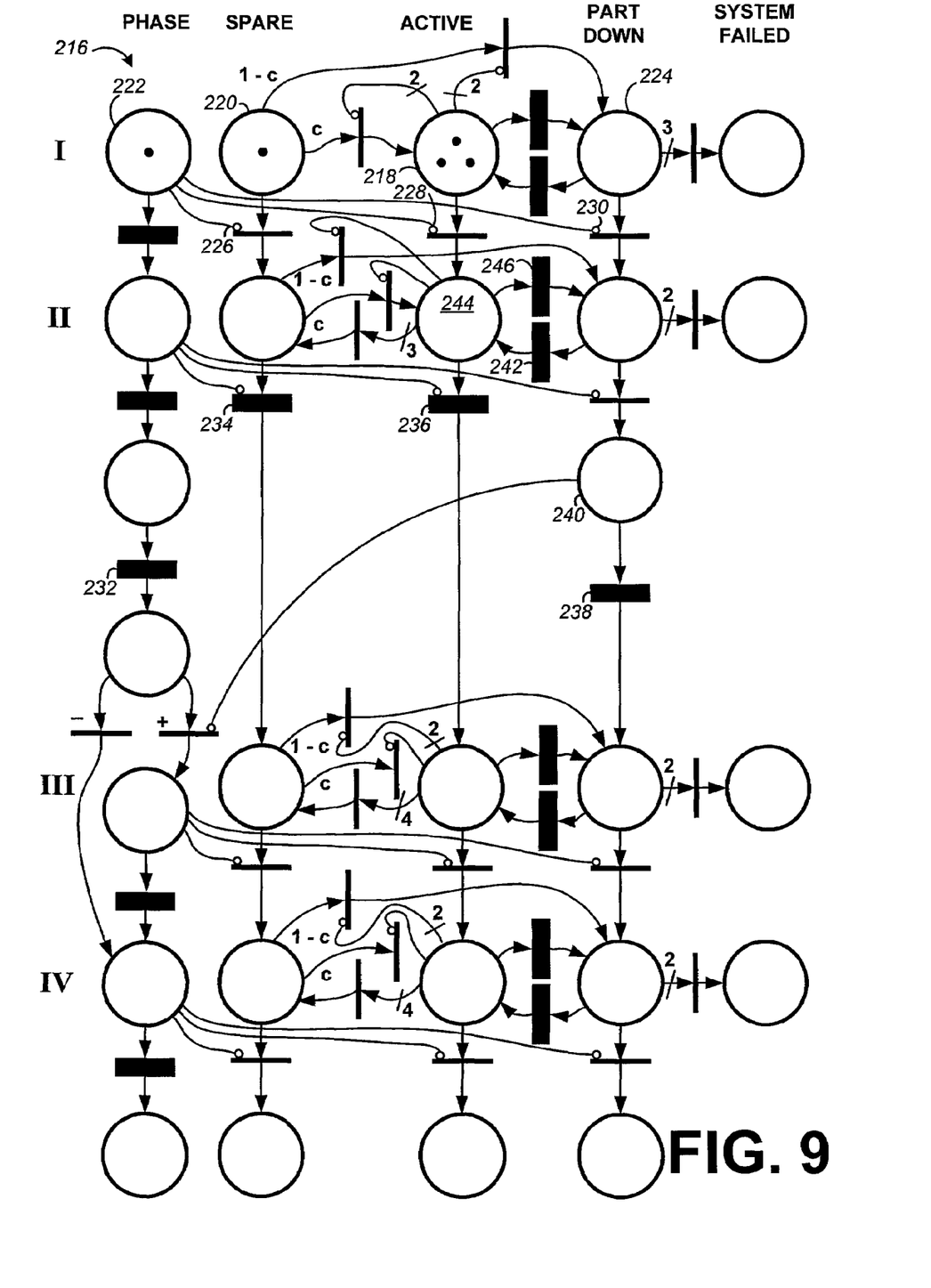
FIG. 9 depicts a block diagram of a multimission system with four phases modeled by a stochastic Petri net with aging tokens, which may be constructed and used to simulate and assess the reliability and performability of a complex system using the modeling system of FIG. 1.

FIG. 9 depicts multimission system 216, modeled using the proposed Petri net extension using aging tokens. The illustrated system includes four phases referenced as Phase I, Phase II, Phase III, and Phase IV. The duration of each phase is a random variable with a general distribution. The system consists of four identical components, which may, for example, be processors in a computer system. In the embodiment of system 216, only a specified number of processors are active at a given phase. The inactive processors are turned off and used as spares. Active processors can fail independently of each other, and the spares do not fail. The three active processors are represented in FIG. 9 by the three tokens initially residing at place 218, and the spare processor is represented by the single token initially residing at place 220. The phase is tracked using the single token located initially at place 222.

The failure distribution is phase-dependent. If a processor fails, it is being repaired in the places in the column marked "PART DOWN" (e.g. see place 224). The repair time is a generally distributed random variable, and the repaired item is considered to be as good as new. If a spare is available and the number of active components is less than required for the mission's success, the spare is activated and moved from the place in the "SPARE" column (e.g. see place 220), to a place in the "ACTIVE" column (e.g. see place 218). The spare reactivation can fail with a certain probability c, which corresponds to failure on demand, or a phase with instantaneous duration. When the spare reactivation fails, the failed spare joins the pool of parts being repaired.

If the number of active processors is less than a predetermined number, the mission fails, which is represented by the places in the column marked "SYSTEM FAILED." Moreover, upon completion of Phase II, a decision is made regarding Phase III. If any of the processors are faulty at that moment, then Phase III is skipped and the system proceeds to Phase IV. Phase I can use up to three processors, and requires two processors to achieve its objective. Phase II uses up to two processors, and requires only one to achieve success, and Phase III and Phase IV require and use exactly three processors.

Unlike conventional Petri net systems without aging tokens, (such as those described in Bondavalli, A. and Mura, I., "High-Level Petri Net Modelling of Phased Mission Systems," *Proceedings of the 10$^{th}$ European Workshop on Dependable Computing*, 1999, hereby incorporated by reference in its entirety) which split the system into two Petri nets, one for modeling the state of the system and one for modeling the phases of mission, the present approach allows modeling of the system in a single Petri net.

Additionally, unlike prior art systems in which the two Petri nets may be connected together using marking-dependent firing policies that are described in two separate tables (one for each net), all the logic is described graphically in the single net of the present aging token system. That is, no marking dependence must be externally specified.

Moreover, the system allows the modeling of general (non-exponential) distribution for parts failure, as well the dependence of the repair rate on which phase the part is in. As shown in FIG. 9, at each phase, a part can be in three possible states: ACTIVE (in use), PART DOWN (failed), or SPARE (inactive), which correspond to the three columns which include places 218, 224, and 220, respectively. The additional leftmost column labeled "PHASE" describes the phase transitions. The four phases I, II, III, and IV correspond to a row of places. In addition, there is a separate row for the decision that is made after the end of phase II. At any phase, a token representing each processor can move within a row of places in accordance with the specified conditions for that phase.

One feature of the modeling is the phase transition implemented by a combination of inhibitors that simultaneously "flush" all the tokens to the next phase. For example, inhibitors 226, 228, and 230 are responsible for the flush of tokens from Phase I to Phase II. Transition 232 includes a small delay c, and transitions 234, 236, and 238 include a delay of 2ε. The delays are introduced to ensure the correct decision about the sequence of phases. Upon the completion of phase II, the decision is made after the first delay $\epsilon$ and before the second delay $2\epsilon$. During that time, the decision place 240 will have a token if any of the processors are inoperative by the end of the phase II. The presence of a token at decision place 240 will result in proceeding directly to phase IV. However, if decision place 240 is empty, Phase III will begin.

In the embodiment of system 216, each of the tokens representing the spare and active parts (those found initially at places 218 and 220) have an age (see, for example, table 54 of FIG. 2) that is used by either the repair transition (e.g. transition 242 in Phase II) or failure transition (e.g. transition 246 in Phase II) to take into account the damage or repair that was accumulated at the previous phase. For a fully repaired-as-new token that is located in an active place, the age value is 1, and this value is then associated with the corresponding failure transition.

The token's age value is calculated based on the time a token spends in the active place during the phase and the CDF for the corresponding failure. For the next phase, with the different CDF for the failure, an equivalent time may be computed and used to evaluate the subsequent movements of the token.

When the unit fails, which may occur after damage has accumulated in several phases, the token is fired to the corresponding PART DOWN (failed) state for the particular phase. The age value for the token representing the failed processor is then reset to one and associated with the repairing transition (e.g. transition 240 in Phase II). Similar to the process of failure, repair can accumulate during several phases until a repair transition (e.g. transition 242 in Phase II) fires and deposits the token into an ACTIVE place (e.g. place 244 in Phase II). While the Petri net representation of system 216 appears to be quite involved, it must be kept in mind that, unlike Petri net representations that do not use aging tokens, each of the relevant features of the multi-phase mission of system 216 are explicitly described. In real-life applications where the complexity may be even greater, hierarchical procedures for constructing Petri nets (such as described in Jensen, K. and Rozenberg, G., editors, *High-Level Petri Nets: Theory and Application,* Springer-Verlag, Berlin; New York, 1991, hereby incorporated by reference in its entirety) are fully applicable for the proposed technique.

It should be emphasized that many variations and modifications may be made to the above-described embodiments. All such modifications and variations are intended to be included herein within the scope of this disclosure and protected by the following claims.

What is claimed is:

1. A method for modeling a system for simulation of time accumulation effects, the method implemented by a computer, the method comprising:
producing, by the computer, a graphical representation of at least one state of the system with at least one directed graph, the at least one directed graph comprising: an aging token, a first place and a second place capable of hosting the aging token, a transition for moving the aging token from the first place to the second place, and at least one directed arc for connecting either of the first place and the second place to the transition;
assigning, by the computer, at least one value to the aging token to represent aging, the at least one value capable of being updated with a counter based on at least one aging policy of the aging token while the aging token resides in either of the first or second place;
delaying the movement of the aging token from the first place to the second place; and
updating, by the computer, the at least one value of the aging token with the counter if the transition has an aging policy matching the at least one aging policy of the aging token.

2. The method of claim 1, wherein the counter is associated with one of the aging token or the transition.

3. The method of claim 1, further comprising:
preserving the at least one value upon the transition firing the aging token from the first place to the second place.

4. The method of claim 1, further comprising:
preserving the at least one value upon the transition firing the aging token from the first place to the second place.

5. The method of claim 4, wherein the at least one value represents any one of:
a number of uses of an object represented by the aging token;
a life span of an object represented by the aging token;
accumulated damage of an object represented by the aging token;
fatigue of a human represented by the aging token;
incubation of a virus represented by the aging token; and
improved properties of a learning process.

6. The method of claim 1, wherein the at least one value comprises a number, an alphanumeric character, a color, or a graphical symbol.

7. The method of claim 1, wherein the graphical representation is configured to simulate any one of:
a repairable system having warm spares;
a load sharing system;
a two-phase periodic mission;
a system having a pool of repairs;
a multimission system;
reliability of a complex system;
spread of an infectious disease;
a learning process; and
fatigue of a human.

8. The method of claim 1, wherein the at least one directed graph is a stochastic Petri net.

9. A modeling system comprising:
a processing device;
a memory; and
a construction module, stored in the memory and executable by the processing device, that builds a graphical representation of at least one state of a system for simulation of time accumulation effects, the graphical representation including at least one directed graph, the at least one directed graph comprising:
a first place and a second place;
an aging token having at least one value to represent aging, the at least one value capable of being updated with a counter based on at least one aging policy of the aging token while the aging token resides in either of the first or second place;
a transition for moving the aging token from the first place to the second place; and
at least one directed arc for connecting either of the first place and the second place to the transition;
wherein the transition is configured to delay the movement of the aging token from the first place to the second place, and the at least one value of the aging token is configured to be updated with the counter if the transition has an aging policy matching the at least one aging policy of the aging token.

10. The modeling system of claim 9, further including:
the counter for updating the at least one value, wherein the counter is associated with one of the aging token or the transition.

11. The modeling system of claim 9, wherein the at least one value of the aging token is configured to be preserved when the aging token is moved from the first place to the second place.

12. The modeling system of claim 9, wherein the at least one value of the aging token is configured to be preserved when the aging token is moved from the first place to the second place.

13. The modeling system of claim 12, wherein the at least one value represents any one of:
- a number of uses of an object represented by the aging token;
- a life span of an object represented by the aging token;
- accumulated damage of an object represented by the aging token;
- fatigue of a human represented by the aging token;
- incubation of a virus represented by the aging token; and
- improved properties of a learning process.

14. The modeling system of claim 9, wherein the at least one value comprises a number, an alphanumeric character, a color, or a graphical symbol.

15. The modeling system of claim 9, wherein the at least one directed graph is configured to simulate any one of:
- a repairable system having warm spares;
- a load sharing system;
- a two-phase periodic mission;
- a system having a pool of repairs;
- a multimission system;
- reliability of a complex system;
- spread of an infectious disease;
- a learning process; and
- fatigue of a human.

16. The modeling system of claim 9, wherein the at least one directed graph is a stochastic Petri net.

17. The modeling system of claim 9, further including:
- a simulation module for simulating the modeled system with the at least one directed graph.

18. A computer readable storage medium, having embodied thereon program embodied code segments that, when executed by a computer system, perform the steps comprising:
- producing a graphical representation of at least one state of a system for simulation of time accumulation effects, the graphical representation including at least one directed graph, the at least one directed graph comprising: an aging token, a first place and a second place capable of hosting the aging token, a transition for moving the aging token from the first place to the second place, and at least one directed arc for connecting either of the first place and the second place to the transition;
- assigning at least one value to the aging token to represent aging, the at least one value capable of being updated with a counter based on at least one aging policy of the aging token while the token resides in either of the first or the second place;
- delaying the movement of the aging token from the first place to the second place; and
- updating the at least one value of the aging token with the counter if the transition has an aging policy matching the at least one aging policy of the aging token.

19. The computer readable storage medium of claim 18, wherein the counter is associated with one of the aging token or the transition.

20. The computer readable storage medium of claim 19, further comprising program embodied code segments that, when executed by the computer system, perform the step comprising:
- preserving the at least one value upon the transition firing the aging token from the first place to the second place.

21. The method of claim 1, further comprising:
- providing the graphical representation of at least one state of the system for display.

22. The method of claim 1, wherein updating the at least one value comprises updating the at least one value by a fraction of the at least one value.

23. The modeling system of claim 9, further comprising:
- a display that displays the graphical representation of at least one state of the system.

24. The computer readable storage medium of claim 18, further comprising program embodied code segments that, when executed by the computer system, perform the step comprising:
- providing the graphical representation of at least one state of the system for display.

25. The modeling system of claim 9, wherein updating the at least one value comprises updating the at least one value by a fraction of the at least one value.

26. The computer readable storage medium of claim 18, wherein updating the at least one value comprises updating the at least one value by a fraction of the at least one value.

* * * * *

UNITED STATES PATENT AND TRADEMARK OFFICE
CERTIFICATE OF CORRECTION

PATENT NO.       : 7,627,459 B2                                                   Page 1 of 1
APPLICATION NO.  : 11/032611
DATED            : December 1, 2009
INVENTOR(S)      : Vitali Volovoi It is certified that error appears in the above-identified patent and that said Letters Patent is hereby corrected as shown below:

At column 3 line 30, delete "In a standard stochastic Petri nets," and replace with --In standard stochastic Petri nets,--.

At column 7 line 28, delete "network card, etc.)" and replace with --network card, etc.--.

At column 16 lines 65-66, delete "a small delay c," and replace with --a small delay $\varepsilon$,--.

At column 17 lines 3-4, delete "will have-a token" and replace with --will have a token--.

Signed and Sealed this

Ninth Day of February, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,627,459 B2 | Page 1 of 1 |
| APPLICATION NO. | : 11/032611 | |
| DATED | : December 1, 2009 | |
| INVENTOR(S) | : Vitali Volovoi | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 784 days.

Signed and Sealed this

Second Day of November, 2010

David J. Kappos
*Director of the United States Patent and Trademark Office*